United States Patent
Sun et al.

(10) Patent No.: US 11,410,810 B2
(45) Date of Patent: Aug. 9, 2022

(54) DISTRIBUTED DEMAGNETIZING COIL SYSTEM, SHIELDING DEVICE, AND DEMAGNETIZING METHOD

(71) Applicant: HARBIN INSTITUTE OF TECHNOLOGY, Harbin (CN)

(72) Inventors: Zhiyin Sun, Harbin (CN); Liyi Li, Harbin (CN); Donghua Pan, Harbin (CN); Kai Song, Harbin (CN); Yuxi Liu, Harbin (CN); Liguo Tan, Harbin (CN); Yiyang Zhao, Harbin (CN)

( * ) Notice: Subject to any disclaimer, the term of this patent is extended or adjusted under 35 U.S.C. 154(b) by 0 days.

(21) Appl. No.: 17/667,635

(22) Filed: Feb. 9, 2022

(65) Prior Publication Data

US 2022/0157505 A1 May 19, 2022

Related U.S. Application Data

(63) Continuation of application No. PCT/CN2019/128524, filed on Dec. 26, 2019.

(30) Foreign Application Priority Data

Dec. 25, 2019 (CN) .......................... 201911359320.5

(51) Int. Cl.
*H01F 13/00* (2006.01)
*H01F 7/20* (2006.01)
*H05K 9/00* (2006.01)

(52) U.S. Cl.
CPC ............. *H01F 13/006* (2013.01); *H01F 7/20* (2013.01); *H05K 9/0075* (2013.01)

(58) Field of Classification Search
CPC ............................ H01F 13/006; H05K 9/0075
See application file for complete search history.

(56) References Cited

U.S. PATENT DOCUMENTS

2011/0237442 A1    9/2011    Uchaykin

FOREIGN PATENT DOCUMENTS

| CN | 1868108 A | 11/2006 |
| CN | 103477285 A | 12/2013 |
| CN | 105074487 A | 11/2015 |

(Continued)

OTHER PUBLICATIONS

Internation Search Report of PCT/CN2019/128524, dated Sep. 25, 2020.

(Continued)

*Primary Examiner* — Ramon M Barrera (57) ABSTRACT

A distributed demagnetizing coil system, a shielding device, and a demagnetizing method. The system includes turns of demagnetizing coils evenly wound on each shielding surface of a shielding body in the shielding device at intervals and connecting wires provided on outer side of the shielding surface in an inflection manner. One half of each turn is located on inner side of the wound shielding body and the other half of each turn s located on outer side of the wound shielding body for providing corresponding demagnetizing magnetic fields to form a closed magnetic flux loop. One half of each connecting wire is connected to the corresponding demagnetizing coil, the other half of each connecting wire is reversely inflected along an original path and is connected to a power supply module, so that corresponding demagnetizing current is introduced into each demagnetizing coil connected to the connecting wire.

8 Claims, 8 Drawing Sheets

(56) References Cited

FOREIGN PATENT DOCUMENTS

| | | |
|---|---|---|
| CN | 109411181 A | 3/2019 |
| JP | H05218677 A | 8/1993 |
| JP | 2015072953 A | 4/2015 |
| SU | 649045 A1 | 2/1979 |

OTHER PUBLICATIONS

Z.Sun, A.Schnabel, M.Burghoff, and L.Li, Calculation of an optimized design of magnetic shields with integrated demagnetization coils, AIP Advances, Jul. 28, 2016.

DISTRIBUTED DEMAGNETIZING COIL SYSTEM, SHIELDING DEVICE, AND DEMAGNETIZING METHOD

CROSS-REFERENCE TO RELATED APPLICATIONS

This application is a continuation of International Patent Application No. PCT/CN2019/128524 with a filing date of Dec. 26, 2019, designating the United States, now pending, and further claims priority to Chinese Patent Application No. 201911359320.5 with a filing date of Dec. 25, 2019. The content of the aforementioned applications, including any intervening amendments thereto, are incorporated herein by reference.

TECHNICAL FIELD

The present invention relates to the technical field of magnetic field shielding, in particular to a distributed demagnetizing coil system, a shielding device and a demagnetizing method.

BACKGROUND OF THE PRESENT INVENTION

A shielding device can shield external geomagnetic fields and environmental interference magnetic fields, and provide an absolute magnetic field and a weak magnetic field environment. The development of aerospace engineering, national defense industry, space science, life science, basic physics and other directions has all put forward application requirements for the shielding device. With the deepening of research, in recent years, the requirements for an internal magnetic field environment of the shielding devices have been continuously improved.

A residual static magnetic field in the shielding device is a direct index to measure how close a near-zero magnetic field thereof is to a true zero magnetic field, which is expressed by an amplitude of static magnetic induction intensity in the inner space of the device. Shielding bodies are usually made of shielding materials with high magnetic permeability (such as permalloy), which means that the shielding materials are magnetized while shielding external magnetic fields. After the external static magnetic fields are shielded, a participating magnetic field and an own magnetic field of the material jointly determine the size of the residual static magnetic field. In order to eliminate/weaken magnetization intensity of the material, the shielding material must be demagnetized.

Demagnetizing coil systems are designed in some shielding devices to demagnetize the shielding materials, which can optimize the residual static magnetic fields inside the shielding devices through demagnetization. However, at present, demagnetizing coil systems in the prior art often have weaknesses such as uneven demagnetizing magnetic fields, leading to different demagnetizing curves of the shielding materials at different positions, different internal magnetization intensities of the shielding materials after demagnetization, and the difficulty of absolute values and gradient distribution of magnetic fields inside the shielding devices in meeting the urgent requirements of increasingly updated scientific research and engineering measurement for a clean magnetic field environment.

Therefore, in view of the above shortcomings, it is necessary to provide a demagnetizing coil system that can demagnetize the shielding device uniformly and efficiently.

SUMMARY OF PRESENT INVENTION

(1) Technical Problems to be Solved

A technical problem to be solved by the present invention is to solve the problems that a demagnetizing coil system of an existing shielding device usually cannot provide a uniform demagnetizing magnetic field and a demagnetization effect is poor.

(2) Technical Solution

In order to solve the above technical problems, the present invention provides a distributed demagnetizing coil system, which comprises a plurality of turns of demagnetizing coils and a plurality of connecting wires;

the plurality of turns of demagnetizing coils are evenly wound on each shielding surface of a shielding body in a shielding device at intervals, one half of each turn of demagnetizing coil is located on the inner side of the wound shielding body and the other half of each turn of demagnetizing coil is located on the outer side of the wound shielding body for providing corresponding demagnetizing magnetic fields to form a closed magnetic flux loop;

the connecting wires are provided on the outer side of the shielding surface in an inflection manner, one half of each connecting wire is a current outlet connecting wire and is connected to the corresponding demagnetizing coil, the other half of each connecting wire is a current loop connecting wire and is reversely inflected along an original path, and the current outlet connecting wire and the current loop connecting wire are connected to a power supply module, so that corresponding demagnetizing current is introduced into each demagnetizing coil connected thereto.

Preferably, in the connecting wires, the current loop connecting wire is arranged outside the current outlet connecting wire.

Preferably, the power supply module comprises a controller, which is connected to each connecting wire and used for generating and sending a corresponding control instruction according to user input to control the demagnetizing current introduced into each demagnetizing coil;

The control instruction generated by the controller comprises a digital waveform corresponding to the demagnetizing current;

The power supply module further comprises:

a digital-to-analog converter connected to the controller and used for receiving the digital waveform and converting the same into an analog signal;

a voltage divider connected to the digital-to-analog converter and used for receiving the analog signal and adjusting an amplitude thereof;

a low-pass filter connected to the voltage divider and used for receiving the analog signal with an adjusted amplitude and filtering a high-frequency interference signal therein;

a power amplifier connected to the low-pass filter and used for receiving the filtered analog signal and outputting a high-power demagnetizing current;

a transformer connected to the power amplifier and used for receiving the high-power demagnetizing current and filtering a DC bias of the demagnetizing current; and a relay connected to the transformer and the connecting wire and used for controlling switching of the corresponding demagnetizing coil.

Preferably, the demagnetizing current introduced into the demagnetizing coil is a linear attenuation demagnetizing current, a second-order attenuation demagnetizing current or an exponential attenuation demagnetizing current.

Preferably, an envelope function expression of the linear attenuation demagnetizing current is:

$$I_E = I_M\left(1 - \frac{tf_D}{n}\right)$$

where $I_M$ is the demagnetizing current that saturates the demagnetizing magnetic field in the direction, $f_D$ is an AC frequency, and n is the number of alternating periods;

an envelope function expression of the second-order attenuation demagnetizing current is:

$$I_E = I_M\left(\frac{tf_D}{n} - 1\right)^2$$

where $I_M$ is a demagnetizing current that saturates the demagnetizing magnetic field in the direction, $f_D$ is an AC frequency, and n is the number of alternating periods;

an envelope function expression of the exponential attenuation demagnetizing current is:

$$I_E = I_M \, e^{-b\frac{tf_D}{n}}$$

where $I_M$ is a demagnetizing current that saturates the demagnetizing magnetic field in the direction, $f_D$ is an AC frequency, n is the number of alternating periods, and b is an adjustment parameter used to adjust a decreasing speed of exponential attenuation;

a current intensity expression of the demagnetizing current introduced into the demagnetizing coil is:

$I=I_E \sin(2\pi f_D t)$.

The present invention further provides a shielding device, which comprises the distributed demagnetizing coil system as described above and at least one layer of the shielding body.

Preferably, the shielding body has a hollow cuboid structure with six plane shielding surfaces, and a plurality of turns of demagnetizing coils are arranged on the six plane shielding surfaces, one half of each turn of demagnetizing coil is located on the inner side of the wound plane shielding surface and the other half is located on the outer side of the plane shielding surface; the turns of demagnetizing coils wound on the four plane shielding surfaces arranged in any direction are distributed in parallel at intervals to form a magnetic flux loop corresponding to the direction; and the corresponding demagnetizing coils on the six plane shielding surfaces form a three-direction orthogonal magnetic flux loop.

Preferably, the interval between the two adjacent turns of parallel demagnetizing coils wound on any shielding surface does not exceed ⅓ of a vertical dimension of the shielding surface along the demagnetizing coil.

Preferably, the shielding body has a hollow cylinder structure, and has an arc-shaped shielding surface and two planar circular shielding surfaces; on the arc-shaped shielding surface, the turns of demagnetizing coils are distributed in parallel at intervals along a circumferential direction of the cylinder, and on the upper and lower planar circular shielding surfaces, the turns of demagnetizing coils are distributed at intervals along a circumferential direction of the planar circular shielding surface around which they are wound.

The present invention further provides a demagnetizing method, which realizes demagnetization based on the shielding device described above, and all layers of shielding bodies in the shielding device are demagnetized at the same time, and demagnetization time is set according to the difference between a size of the outermost layer of shielding body and a size of the innermost layer of shielding body.

(3) Beneficial Effects

The technical solution of the present invention has the following advantages: the present invention provides a distributed demagnetizing coil system, a shielding device and a demagnetizing method. The distributed demagnetizing coil system comprises the plurality of turns of demagnetizing coils, and the demagnetizing coils are distributed; and the plurality of demagnetizing coils are evenly distributed on each shielding surface of the shielding device at intervals, so that the extremely uniform demagnetizing magnetic fields can be generated, soft magnetic materials located everywhere in the shielding body are fully and uniformly demagnetized, the uniformity of the demagnetizing magnetic fields borne by the shielding device is greatly improved, and the demagnetization effect is greatly improved. In addition, the outlet and loop of the demagnetizing current introduced into the demagnetizing coil are set side by side, and interference magnetic fields generated by the currents in the connecting wires and with different directions from that of a target demagnetizing magnetic field can offset each other out, further reducing the interference magnetic fields and improving the demagnetization effect.

In the figures: 1: shielding body; 2: first demagnetizing coil; 3: corner holes; 4: second demagnetizing coil; 5: side wire hole; 6. connect outlet connecting wire; 7. current loop connecting wire; 8: current input port; 9: current output port; 10: controller; 11: digital-to-analog converter; 12: voltage divider; 13: low-pass filter; 14: power amplifier; 15: transformer; and 16: relay.

DETAILED DESCRIPTION OF PREFERRED EMBODIMENTS

To make the purpose, the technical solutions and advantages of the embodiments of the present invention more clear, the technical solutions in the embodiments of the present invention will be clearly and fully described below in combination with the drawings in the embodiments of the present invention. Apparently, the described embodiments are merely part of the embodiments of the present invention, not all of the embodiments. Based on the embodiments in the present invention, all other embodiments obtained by those ordinary skilled in the art without contributing creative labor will belong to the protection scope of the present invention.

Embodiment 1

Figure 1:
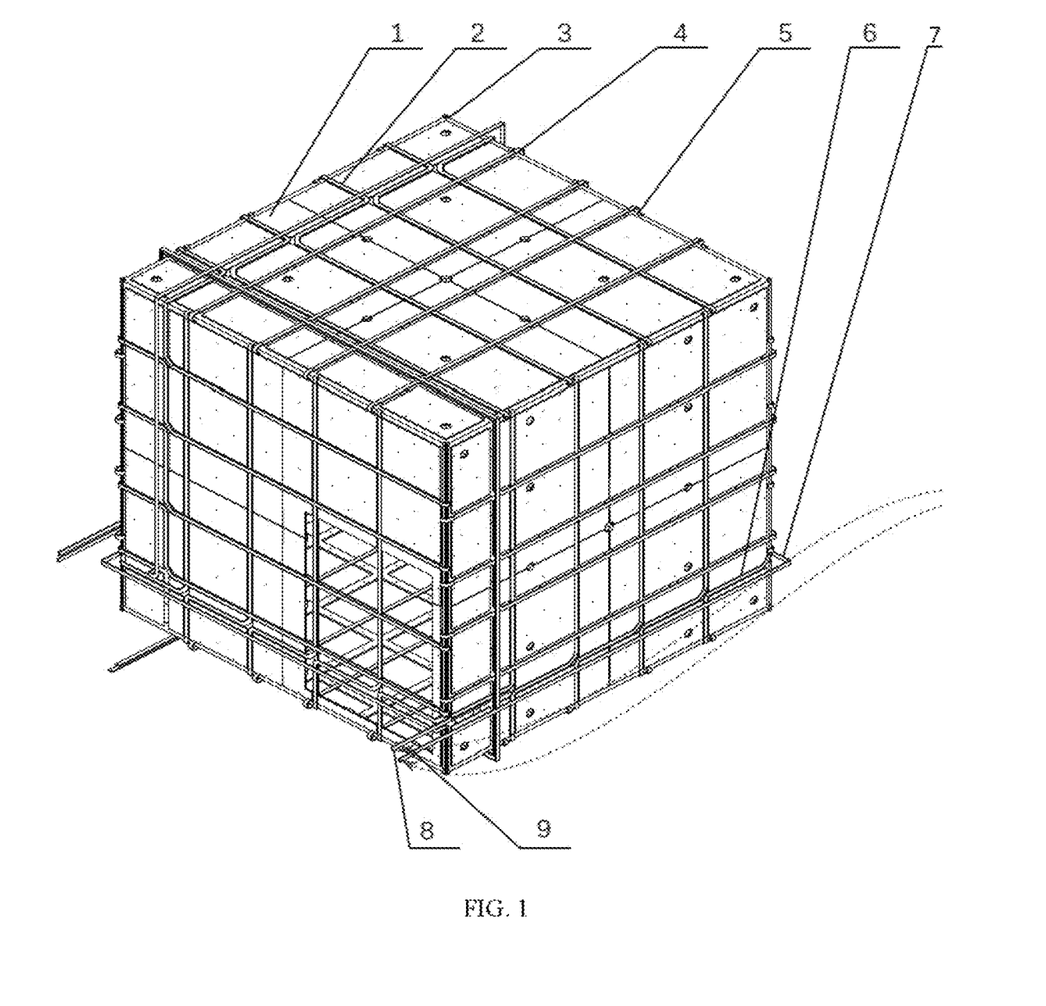
FIG. 1 is a schematic diagram of a coil winding structure (3 directions) of a distributed demagnetizing coil system in an embodiment of the present invention.

As shown in FIG. 1, a distributed demagnetizing coil system provided by an embodiment of the present invention comprises a plurality of turns of demagnetizing coils and a plurality of connecting wires.

A shielding device comprises a shielding body 1 composed of at least one layer of shielding material, and the demagnetizing coils need to be wound with the shielding material to form a closed magnetic flux loop, so that the shielding material can be magnetized to saturation during demagnetization. The demagnetizing coils may be wound with copper wires with an insulating layer, which is not further limited here.

Specifically, in the shielding device, the plurality of turns of demagnetizing coils are evenly wound on each shielding surface of the shielding body 1 at intervals. The evenly spaced distribution comprises evenly spaced distribution along a width direction, a length direction, a height direction or a circumferential direction of the shielding surface (i.e. equiangular evenly spaced distribution).

As shown in FIG. 1, the shielding body 1 is provided with wire holes at the positions where threading is required, including corner holes 3 arranged near corners of the shielding body 1 and side wire holes 5 arranged near the edges of the shielding body 1. The demagnetizing coils are respectively inserted into the corresponding wire holes, and then wound around the shielding body 1. One half of each turn of demagnetizing coil is located on the inner side of the wrapped shielding body 1 and the other half is located on the outer side of the shielding body 1, and generated magnetic fields are located in the shielding surface to provide corresponding demagnetizing magnetic fields to form a closed magnetic flux loop.

Figure 2:
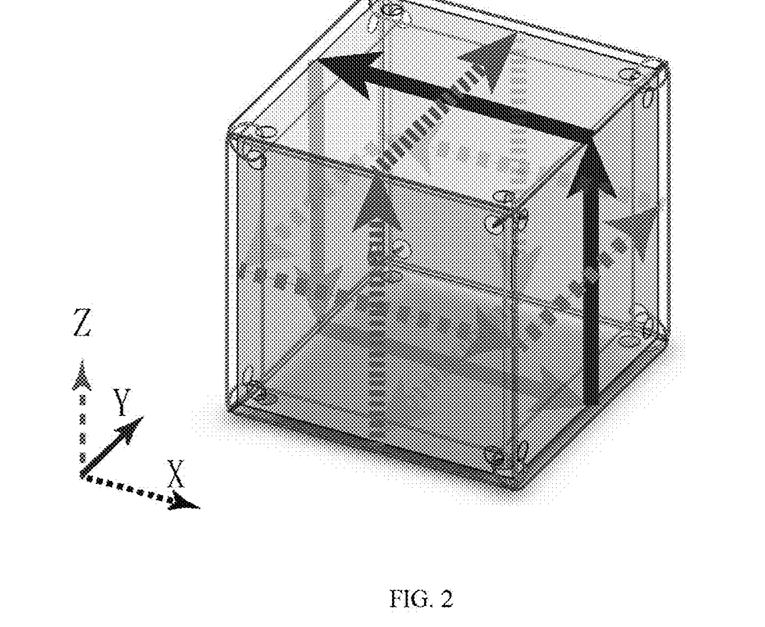
FIG. 2 is a schematic diagram of generation of a magnetic flux loop (3 directions) in a distributed demagnetizing coil system in an embodiment of the present invention.
Figure 3A:
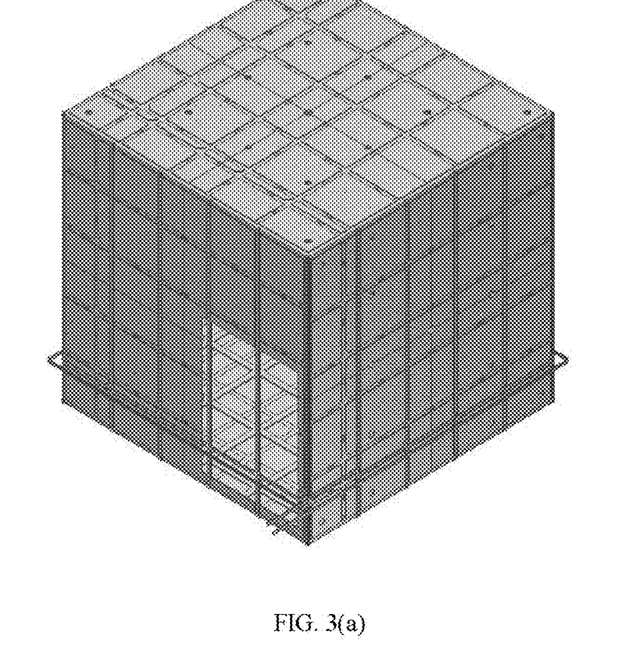
FIG. 3(a) is a schematic diagram of a coil winding structure (Z direction) of a distributed demagnetizing coil system in an embodiment of the present invention.
Figure 3B:
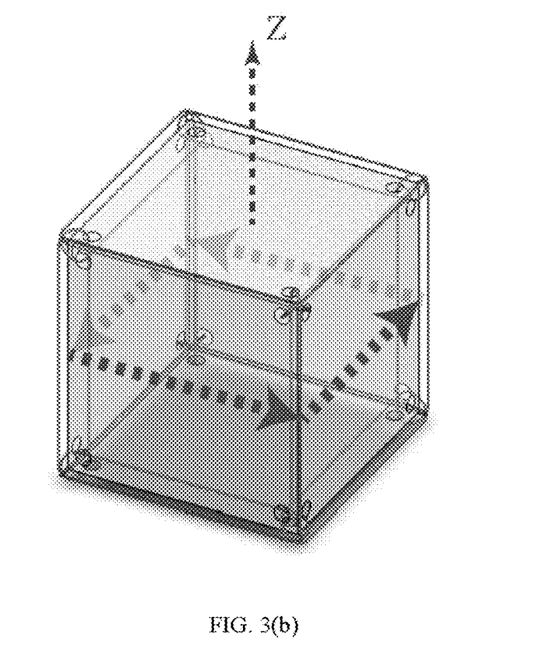
FIG. 3(b) is a schematic diagram of generation of a magnetic flux loop (Z direction) in a distributed demagnetizing coil system in an embodiment of the present invention.

As shown in FIG. 1, in a specific implementation, two demagnetizing coils with different directions are arranged on one shielding surface of the shielding body 1 with a hollow cuboid structure: a first demagnetizing coil 2 and a second demagnetizing coil 4. After the six shielding surfaces of the shielding body 1 are provided with the corresponding demagnetizing coils, the magnetic flux loops with three orthogonal directions as shown in FIG. 2 can be generated. Specifically, FIG. 3(a) shows a schematic diagram of a coil winding structure (Z direction) of the distributed demagnetizing coil system, and FIG. 3(b) shows a schematic diagram of the magnetic flux loop (Z direction) generated by the distributed demagnetizing coil system. The central axis of the magnetic flux loop composed of the plurality of turns of demagnetizing coils corresponding to the Z direction is along the Z direction.

Because the demagnetizing coils are distributed on the whole shielding surface at intervals, more uniform demagnetizing magnetic fields can be generated, so that a soft magnetic material located everywhere in the shielding device is fully and consistently demagnetized. Compared with a solution with centralized demagnetizing coils in which the demagnetizing coils are only arranged at the edge of the shielding surface (the edge of the shielding body 1), the uniformity of demagnetizing magnetic field borne by the shielding device is significantly improved when the same demagnetizing current is applied.

Each connecting wire is inflected and arranged outside the shielding surface. As shown in FIG. 1, one half of each connecting wire is a current outlet connecting wire 6, which is connected to the corresponding demagnetizing coil thereof, and the other half is a current loop connecting wire 7 which is reversely inflected along an original path, that is, the outlet of the connecting wire is parallel to the loop, and paths of both are basically the same. Two open ends formed by inflection of the connecting wires: one end of the current outlet connecting wire 6, that is, a current input port 8, and one end of the current loop connecting wire 7, that is, a current output port 9, are all connected to a power supply module, so that corresponding demagnetizing currents are introduced into each demagnetizing coil connected to the connecting wires, and the demagnetizing coils can generate demagnetizing magnetic fields as required. In one connecting wire, the demagnetizing coils connected thereto realize synchronous power suppl.

Figure 4A:
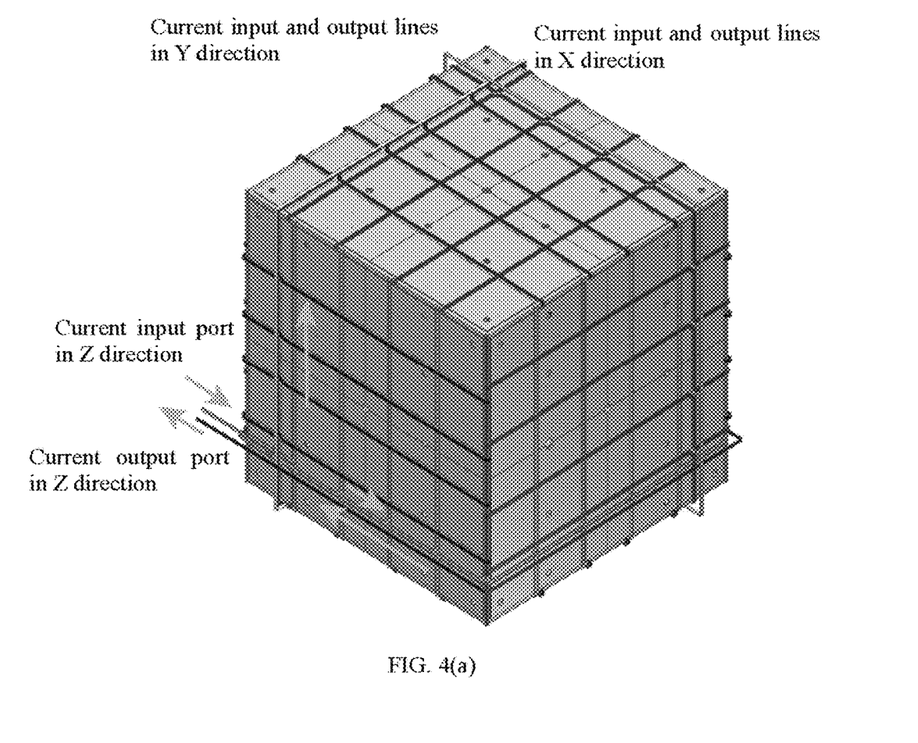
FIG. 4(a) is a schematic diagram of a coil connection mode (corresponding to three directions) of a distributed demagnetizing coil system without magnetic interference in an embodiment of the present invention.
Figure 4B:
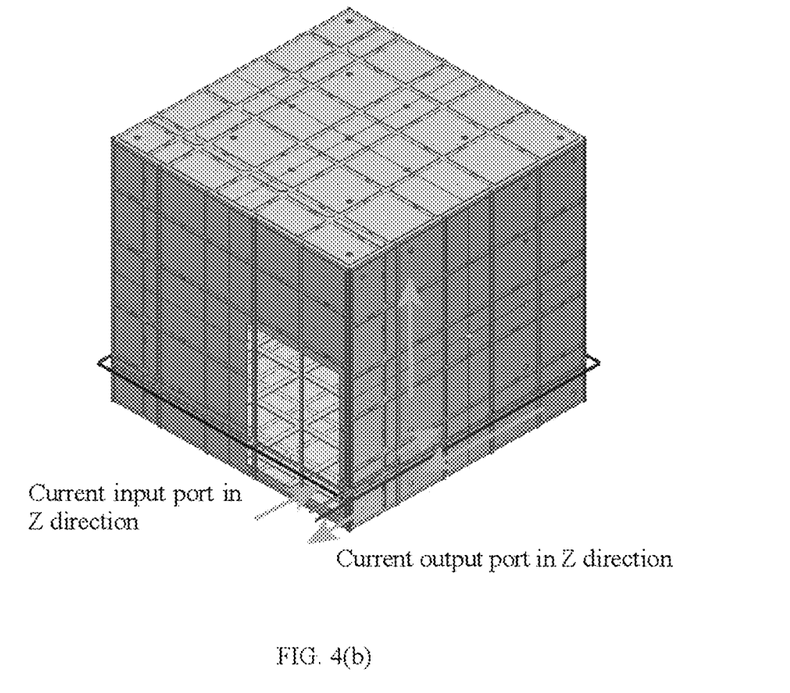
FIG. 4(b) is a schematic diagram of a coil connection mode (corresponding to Z direction only) of a distributed demagnetizing coil system without magnetic interference in an embodiment of the present invention.

In the distributed demagnetizing coil system provided by the present invention, connection between each turn of demagnetizing coil passing through the corresponding wire hole adopts a connection mode of mutual offsetting of currents and magnetic fields, as shown in FIG. 4. FIG. 4(a) shows a schematic diagram of a coil connection mode of the distributed demagnetizing coil system corresponding to 3 directions without magnetic interference. FIG. 4(b) shows a schematic diagram of a coil connection mode of the distributed demagnetizing coil system without magnetic interference corresponding to Z direction only. When one turn of demagnetizing coil is wound, the coil is connected to the position of the next demagnetizing coil through the connecting wire. The current in the connecting wire between the two turns of demagnetizing coil will generate an interference magnetic field other than a target demagnetizing magnetic field. Therefore, the current loop connecting wire 7 (loop) turns back along the original path of the current outlet connecting wire 6 (outlet), so that the outlet and loop of the demagnetizing current in each connecting wire are parallel, and the magnetic fields generated by the two currents offset each other and compensate each other. Therefore, an interference magnetic field other than the demagnetizing magnetic field will not be generated, and a demagnetization effect is ensured.

Preferably, in the connecting wires of the distributed demagnetizing coil system, the current loop connecting wire 7 is arranged outside the current forward connecting wire 6. In this way, the coil providing the demagnetizing magnetic field can be attached to the shielding material as much as possible to reduce magnetic leakage in the air. In this way, the connecting wires can also be protected, and problems in line power supply can be avoided.

To sum up, compared with a general demagnetization system, the distributed demagnetizing coil system provided by the present invention can greatly improve the demagnetization effect, reduce a static magnetic field in the shielding device to a very low level, and effectively satisfy an urgent requirement for a non-magnetic environment during weak magnetic field signal detection.

In some preferred implementations, in the distributed demagnetizing coil system provided by the present invention, the power supply module comprises a controller 10, and the controller 10 is connected to each connecting wire for generating and sending a corresponding control instruction according to user input to control the demagnetizing current of each demagnetizing coil. Through the controller 10, parameters such as a frequency and the amplitude of the demagnetizing current introduced into the distributed demagnetizing coil system can be changed, so as to realize precise automatic control of the demagnetizing current and avoid errors caused by manual operations.

Figure 5:
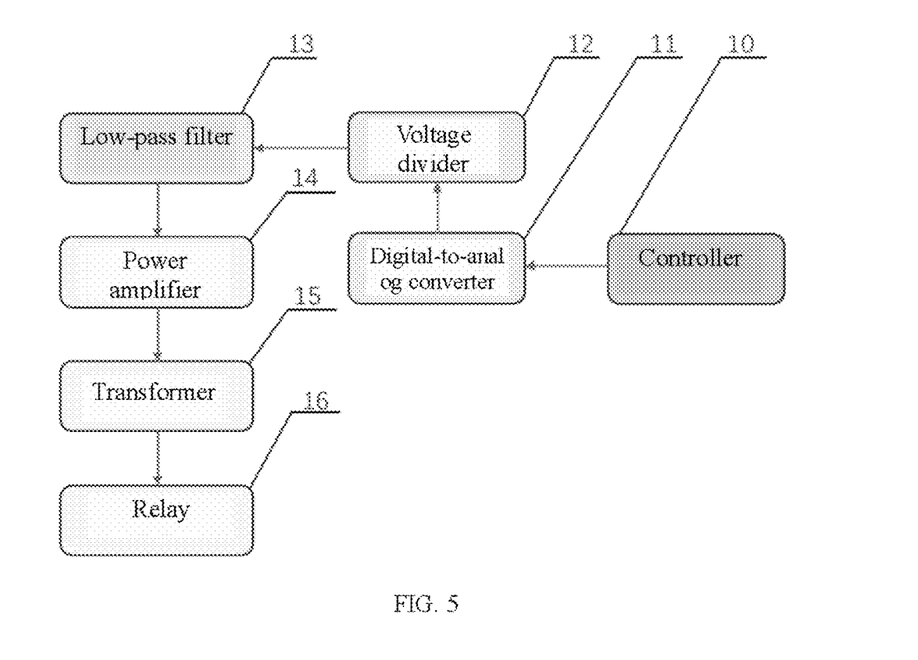
FIG. 5 is a structural block diagram of a power supply module of a distributed demagnetizing coil system in an embodiment of the present invention.

Preferably, as shown in FIG. 5, the power supply module further comprises a digital-to-analog converter 11, a voltage divider 12, a low-pass filter 13, a power amplifier 14, a transformer 15 and a relay 16. The control instruction generated by the controller 10 comprises a digital waveform corresponding to the demagnetizing current, that is, the controller 10 is used for generating a programmable digital waveform according to the user input. The digital-to-analog converter 11 is connected to the controller 10, and is used for receiving the digital waveform and converting the same into an analog signal. The digital waveform is changed into an analog signal for power amplification via the digital-to-analog converter 11. The voltage divider 12 is connected to the digital-to-analog converter 11 and used for receiving the analog signal and adjusting an amplitude thereof. The amplitude of the analog signal adjusted by the voltage divider 12 is suitable for a maximum input signal range of the power amplifier 14, and the accuracy of the digital-to-analog converter 11 is fully utilized. The low-pass filter 13 is connected to the voltage divider 12, and used for receiving the analog signal with the adjusted amplitude and filtering a high-frequency interference signal therein to filter out the high-frequency interference signal. The power amplifier 14 is connected to the low-pass filter 13 and is used for receiving the filtered analog signal and outputting a high-power demagnetizing current. The transformer 15 is connected to the power amplifier 14 and used for receiving the high-power demagnetizing current and filtering a DC bias of the demagnetizing current, so as to prevent the demagnetization process from magnetizing the shielding device instead. The relay 16 is connected to the transformer 15 and the connecting wires, and is used for controlling switching of the corresponding demagnetizing coil to change a demagnetization sequence. The demagnetizing current provided by the power supply module is injected into the demagnetizing coils, wherein a connection terminal is a non-magnetic terminal, and finally the demagnetizing magnetic field is generated. The power amplifier 14 should adopt a current source mode to ensure that a control signal directly controls the current in the demagnetizing coils, that is, directly controls the demagnetizing magnetic fields.

The power supply module provided by the present invention can realize introduction of the demagnetizing current of any envelope function to each demagnetizing coil, can ensure that the error and DC offset of the demagnetizing current are within the allowable range, and can realize the sequential demagnetization control of the demagnetizing coils in different layers of the shielding body and different directions (the central axis of the magnetic flux loop is in different directions), which is more accurate, efficient and reliable than manual control. During application, a power level of the power amplifier 14 is determined by the specific shielding device. According to the size of shielding device and the shielding material, the amplitude of the demagnetizing magnetic field and demagnetizing current should be determined, and the demagnetizing coil should have appropriate wire specifications, so that a voltage value that the power amplifier 14 should provide can be determined.

Figure 6A:
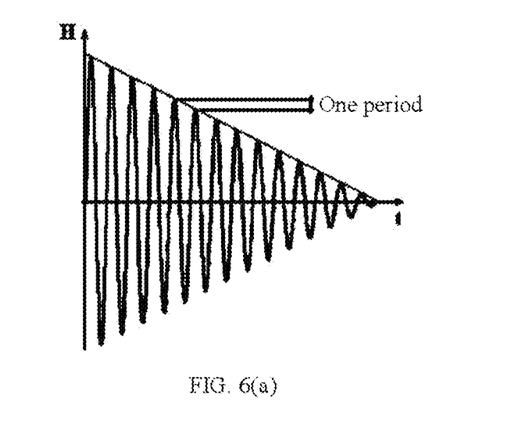
FIG. 6(a) is a schematic diagram of a demagnetizing magnetic field provided by a distributed demagnetizing coil system in an embodiment of the present invention.
Figure 6B:
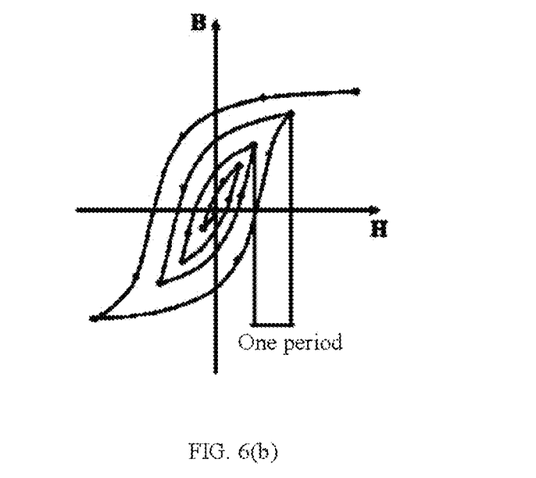
FIG. 6(b) is a schematic diagram of a magnetizing curve inside a shielding material corresponding to FIG. 6(a)
Figure 7A:
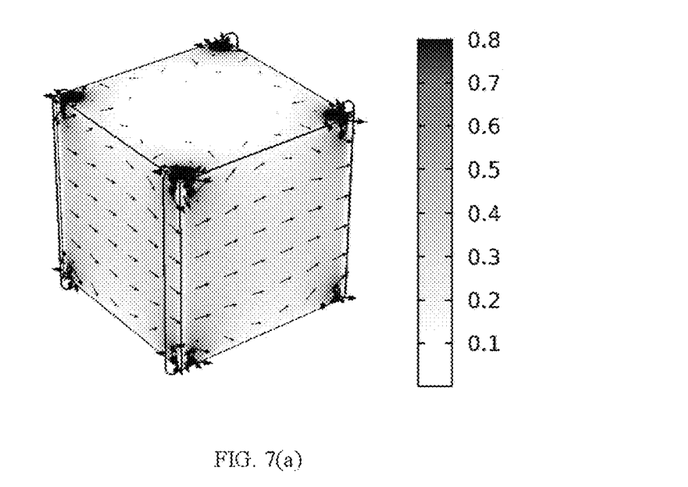
FIG. 7(a) shows a demagnetizing magnetic field generated by installing demagnetizing coils only at edges (corresponding to Z direction only)
Figure 7B:
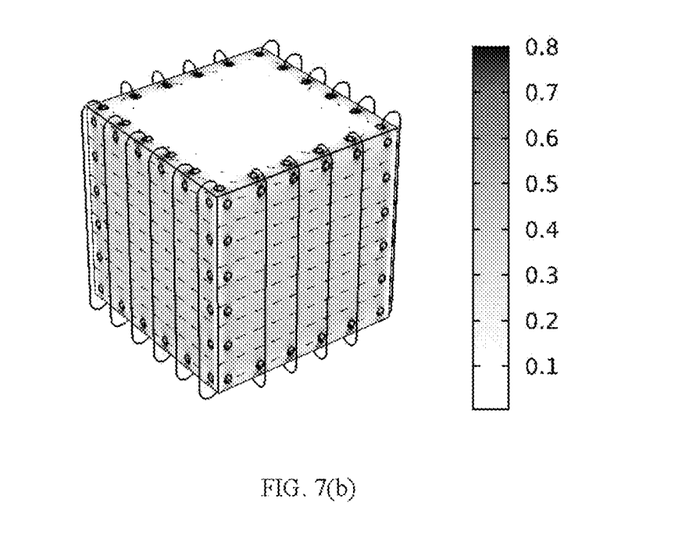
FIG. 7(b) shows a demagnetizing magnetic field generated by a distributed demagnetizing coil system (corresponding to Z direction only)
Figure 7C:
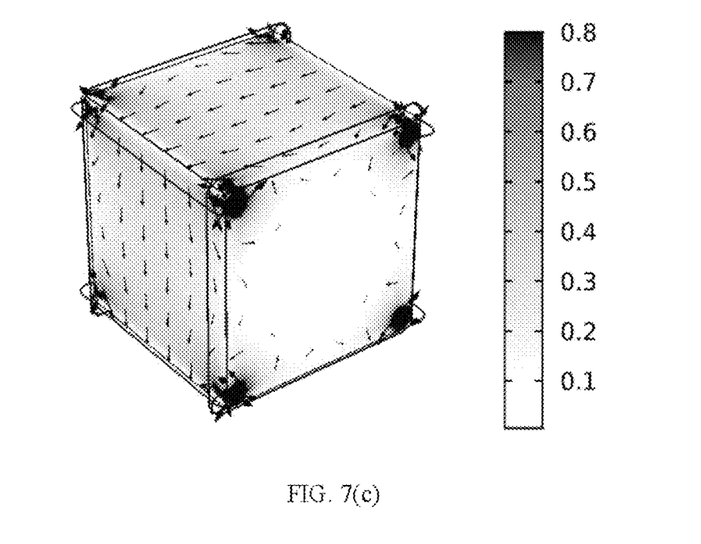
FIG. 7(c) shows a demagnetizing magnetic field generated by installing demagnetizing coils only at edges (corresponding to X direction only)
Figure 7D:
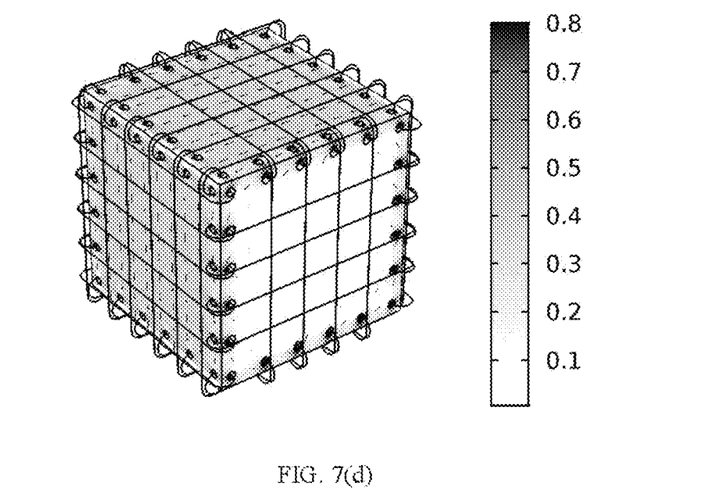
FIG. 7(d) shows a demagnetizing magnetic field generated by a distributed demagnetizing coil system (corresponding to X direction only)
Figure 7E:
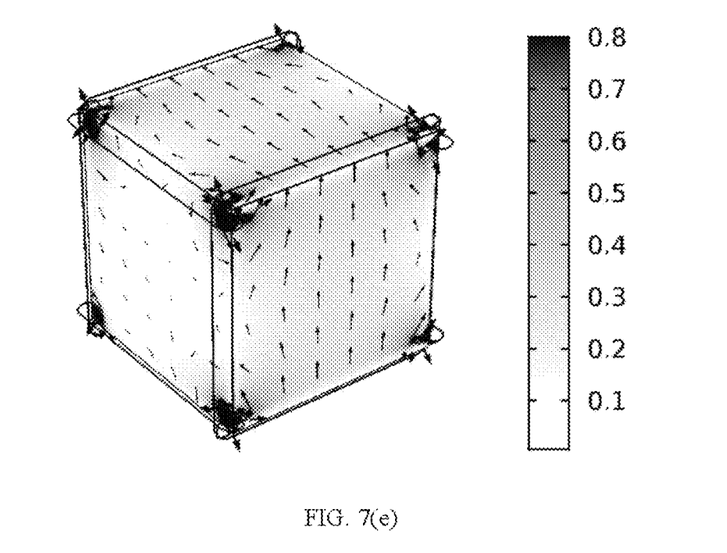
FIG. 7(e) shows a demagnetizing magnetic field generated by installing demagnetizing coils only at edges (corresponding to Y direction only)
Figure 7F:
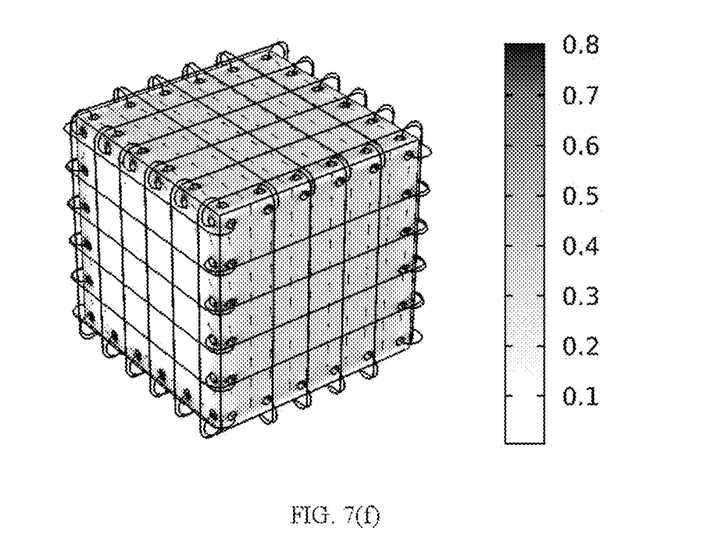
FIG. 7(f) shows a demagnetizing magnetic field generated by a distributed demagnetizing coil system (corresponding to Y direction only)

Please refer to FIG. 6. FIG. 6(*a*) shows the demagnetizing magnetic field of the distributed demagnetizing coil system provided by the present invention in a specific implementation. FIG. 6(*b*) shows a demagnetizing curve of the corresponding shielding material, with the demagnetizing magnetic field H on the horizontal axis and magnetic induction intensity B inside the material on the vertical axis. During demagnetization, an AC current with a decreasing amplitude is applied to the demagnetizing coil, so that the shielding material bears a decreasing AC demagnetizing magnetic field. The material is magnetized repeatedly with the magnetic field, and the magnetic induction intensity follows the change of a hysteresis loop, and approaches to zero in a vortex mode. When the demagnetizing magnetic field decreases to zero, the magnetization intensity and magnetic induction intensity of the soft magnetic materials also approach to zero.

The amplitude of the demagnetizing magnetic field is determined by the demagnetizing current and the size of the shielding device. In order to achieve the best demagnetization effect, an initial value of demagnetizing magnetic field should make the shielding material saturated. For example, for a permalloy-type shielding material, the internal magnetic induction intensity should be about 0.6-0.8 T. For a specific shielding device, an appropriate initial value of the demagnetizing current should be applied according to specific shielding surface size and shielding material.

It should be noted that the demagnetizing magnetic field shown in FIG. 6(*a*) has 14 sinusoidal periods in a whole descending process, which is to show a changing rule of the demagnetizing magnetic field. In fact, those of skill in the art can use a demagnetizing magnetic field with more periods to realize demagnetization. Empirical evidence shows that demagnetizing magnetic field with 1000-2000 periods already has a good demagnetization effect. The demagnetizing magnetic field shown in FIG. 6(a) decreases in amplitude with time in a linear rule (i.e., a linear attenuation demagnetizing current is used), which is only the simplest way of implementation. Those skilled in the field can adopt demagnetizing magnetic fields with other rule, such as demagnetizing magnetic fields with exponential rules of different descending speeds, etc.

Preferably, in the distributed demagnetizing coil system of the present invention, the demagnetizing current introduced into the demagnetizing coil is a linear attenuation demagnetizing current, a second-order attenuation demagnetizing current or an exponential attenuation demagnetizing current.

Further, an envelope function expression of linear attenuation demagnetizing current is:

$$I_E = I_M \left(1 - \frac{tf_D}{n}\right)$$

where $I_M$ is a demagnetizing current that saturates the demagnetizing magnetic field in the direction, $f_D$ is an AC frequency, and n is the number of alternating periods.

Particularly, in order to make the demagnetization process more finely control the demagnetizing curve to approach to zero steadily, the distributed demagnetizing coil system provided by the present invention may also adopt the following two specific demagnetizing current waveforms to realize demagnetization, that is, the demagnetizing current introduced into the demagnetizing coil is the second-order attenuation demagnetizing current or the exponential attenuation demagnetizing current, so as to speed up an attenuation speed of demagnetizing magnetic field intensity, and make an attenuation speed of demagnetizing magnetic flux density consistent in the demagnetization process.

Specifically, an envelope function expression of the second-order attenuation demagnetizing current is:

$$I_E = I_M \left(\frac{tf_D}{n} - 1\right)^2$$

where $I_M$ is a demagnetizing current that makes the demagnetizing magnetic field saturated in tje direction (the central axis of the magnetic flux loop is in different directions), $f_D$ is an AC frequency, and n is the number of alternating periods.

An envelope function expression of the exponential attenuation demagnetizing current is:

$$I_E = I_M \, e^{-b\frac{tf_D}{n}}$$

where $I_M$ is a demagnetizing current that makes the demagnetizing magnetic field in the direction (the central axis of the magnetic flux loop is in different directions) saturated, $f_D$ is an AC frequency, n is the number of alternating periods, and b is an adjustment parameter used to adjust a descending speed of exponential attenuation.

Current intensity of the demagnetizing current introduced into the demagnetizing coil is related to the envelope function, and the current intensity expression is:

$$I = I_E \sin(2\pi f_D t).$$

Further, in order to accurately control the demagnetizing curve of the shielding material in the shielding device, it should be ensured that the material just reaches saturation in an initial period: remanence Br of the material cannot be completely eliminated due to unsaturation, while the number of effective demagnetization periods is reduced due to over saturation in the limited demagnetization time. The distributed demagnetizing coil system provided by the present invention preferably adopts a method of independently controlling the demagnetizing coils in different directions (the central axis of the magnetic flux loop is in different directions) for demagnetization, and an initial amplitude of the demagnetizing current is determined according to the length of each magnetic circuit.

In some preferred implementations, when the shielding device comprises more than one layer of shielding bodies, but is composed of multiple layers of shielding bodies, different layers of shielding bodies are provided with corresponding demagnetizing coils, and the demagnetization sequence of demagnetizing coils on each layer of shielding bodies can be controlled by the controller 10.

In order to demagnetize the shielding material as thoroughly as possible, it is necessary for the shielding material at different positions on the shielding device to experience the demagnetizing magnetic field with the same precision as possible, that is, an initial demagnetizing magnetic field is consistent, a demagnetizing magnetic field decreasing rule is consistent, and the demagnetizing magnetic field at the last moment is consistent. Further, in order to keep the demagnetizing currents of all demagnetizing coils corresponding to one direction consistent, the connecting wires corresponding to all demagnetizing coils corresponding to one direction on the same layer of shielding body 1 in the shielding device can be connected in series to form a current loop, which can avoid mutual interference of the demagnetizing coils caused by incomplete consistency of the demagnetizing currents when the demagnetizing coils are separately controlled.

Embodiment 2

Embodiment 2 of the present invention provides a shielding device, which comprises the distributed demagnetizing coil system and at least one layer of the shielding body in any of the above descriptions. When the shielding device comprises multiple layers of shielding bodies, each layer of shielding bodies is nested step by step from inside to outside.

In some preferred embodiments, the shielding body has a hollow cuboid structure (including a cube structure) with six plane shielding surfaces, on which there are a plurality of turns of demagnetizing coils. One half of each turn of demagnetizing coil is located on the inner side of the plane shielding surface, and the other half is located on the outer side of the plane shielding surface. On the four plane shielding surfaces arranged along any direction, the turns of demagnetizing coils are distributed in parallel at intervals, and the plurality of turns of demagnetizing coils form a magnetic flux loop corresponding to the direction. As shown in FIG. 1 to FIG. 3, among the six planes of the cuboid, two groups of opposite planes (four planes in total) perpendicular to the X and Y directions are all arranged along the Z direction, and the four planes are all wound with the plurality of turns of demagnetizing coils arranged in parallel at intervals, and demagnetizing magnetic fields generated correspondingly constitutes a magnetic flux loop of the central axis along the Z direction. Two groups of demagnetizing coils corresponding to different directions (the central axis of the magnetic flux loop is in different directions) are wound on each shielding surface, and all the demagnetizing coils corresponding to six plane shielding surfaces form a magnetic flux loop with three orthogonal directions. In other words, a composite demagnetizing magnetic field generated by the plurality of demagnetizing coils forms a magnetic flux loop around the four sides of the shielding device, the magnetic flux loop has a central rotation axis, and all the demagnetizing coils of the six shielding surfaces can generate three demagnetizing magnetic fields with rotation axes of X, Y and Z axes respectively.

Please refer to FIG. 7, the present invention compares the technical solution (a solution with centralized demagnetizing coils) in which demagnetizing coils are only arranged at edges with the technical solution provided by the present invention, wherein a color scale unit is magnetic induction intensity unit T. FIG. 7(a) shows the demagnetizing magnetic field generated by the solution with the centralized demagnetizing coils only corresponding to the Z direction. FIG. 7(b) shows the demagnetizing magnetic field generated by the distributed demagnetizing coil system corresponding to the Z direction only. FIG. 7(c) shows the demagnetizing magnetic field generated by the solution with the centralized demagnetizing coils corresponding to the X direction only. FIG. 7(d) shows the demagnetizing magnetic field generated by the distributed demagnetizing coil system corresponding to the X direction only. FIG. 7(e) shows the demagnetizing magnetic field generated by the solution with the centralized demagnetizing coils corresponding to the Y direction only. FIG. 7(f) shows the demagnetizing magnetic field generated by the distributed demagnetizing coil system corresponding to the Y direction only. It can be seen from FIG. 7 that the demagnetizing coils of the present invention not only exist at the edges of the shielding surface, but are also distributed on the whole shielding surface. Corresponding to each direction, the magnetic flux distribution on the four sides is uniform, redundant magnetic fields on the top and bottom surfaces are less, and an amplitude of an interference magnetic field is lower. Because the distribution of magnetic induction intensity inside the demagnetized material is consistent with the distribution of magnetic field intensity generated by tiny currents, the uniformity of magnetic induction intensity inside the demagnetized material and inside a shielding room is improved.

Specific numbers and positions of the demagnetizing coils in the shielding device can be comprehensively set according to the specific size, material and structure of the shielding device. Preferably, in order to obtain a better demagnetization effect, the interval between two adjacent turns of parallel demagnetizing coils wound on any shielding surface should not exceed ⅓ of a vertical dimension of the shielding surface along the two turns of demagnetizing coils. Preferably, the interval should not exceed ⅕ of the vertical dimension. Here, the vertical dimension is a dimension of the shielding surface in the vertical coil direction. If the turns of demagnetizing coils are arranged in parallel at intervals along the length direction of the shielding surface, the length direction is perpendicular to each demagnetizing coil. The length is the dimension of the shielding surface in the vertical coil direction. The distance between two adjacent demagnetizing coils should not exceed ⅓ (preferably ⅕) of the length of the shielding surface. Similarly, if the turns of demagnetizing coils are arranged in parallel at intervals along the width direction of the shielding surface, the distance between two adjacent demagnetizing coils should not exceed ⅓ (preferably ⅕) of the width thereof.

Preferably, the turns of demagnetizing coils wound on the same plane shielding surface are connected to the same connecting wire, and further, the corresponding connecting wires of the turns of demagnetizing coils corresponding to the same direction (that is, the central axis of the magnetic flux loop is in the same direction) are connected in series to realize synchronous demagnetization in the same direction. That is, firstly, the demagnetizing coils of each plane shielding surface are connected as a group, and then all the demagnetizing coils of four shielding surfaces arranged along the Z direction are connected as a group, and the same is true for the X and Y directions. Finally, there are two terminals for current input and output. This connection method can simplify the connection circuit, and it is easier to install a coil in practical engineering.

Figure 8:
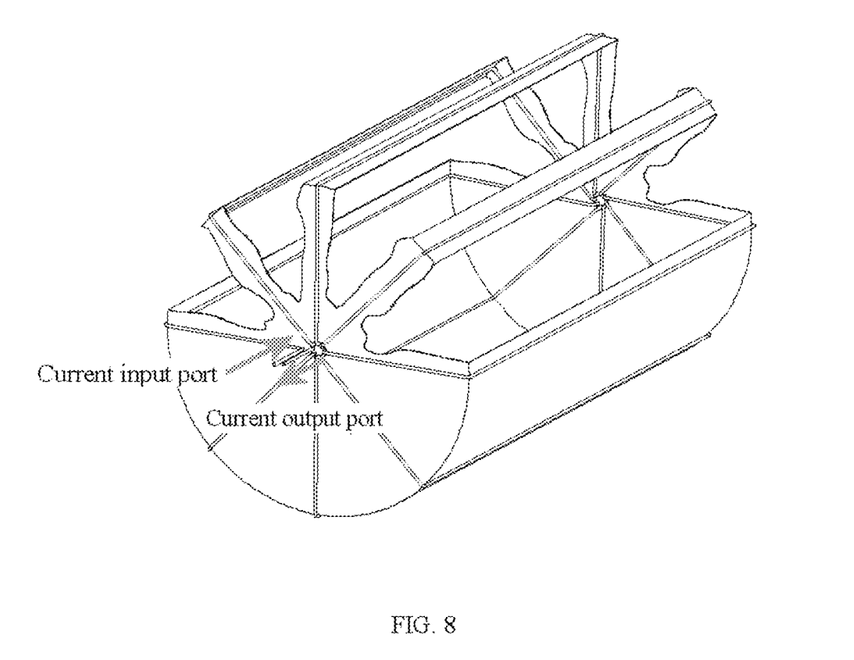
FIG. 8 is a schematic diagram of a coil winding structure of another distributed demagnetizing coil system in an embodiment of the present invention.

As shown in FIG. 8, in some preferred implementations, the shielding body can also adopt a hollow cylinder structure, which has an arc-shaped shielding surface and two planar circular shielding surfaces. The arc-shaped shielding surface is provided with a plurality of turns of demagnetizing coils uniformly distributed, and each turn of demagnetizing coil is distributed in parallel at intervals along the circumferential direction of the cylinder, so as to form a demagnetizing magnetic field with the central axis of the magnetic flux loop along the central symmetry axis of the cylinder. The upper and lower planar circular shielding surfaces are also provided with a plurality of turns of demagnetizing coils which are evenly distributed, and each turn of demagnetizing coil is distributed at intervals along a circumferential direction of the planar circular shielding surface around which it is wound, that is, the center and edge of the planar circular shielding surface are provided with wire holes, and each turn of demagnetizing coil is arranged along the circular radial direction and distributed around the center of the circle, which also constitutes the demagnetizing magnetic field of the central axis of the magnetic flux loop along the central symmetry axis of the cylinder. Particularly, the demagnetizing coil on the arc-shaped shielding surface may or may not be connected to the demagnetizing coil on the planar circular shielding surface.

Embodiment 3

Embodiment 3 of the present invention provides a demagnetizing method, which realizes demagnetization based on the shielding device in any of the above descriptions, wherein all layers of shielding bodies in the shielding device are demagnetized at the same time, and demagnetization time is set according to the difference between a size of the outermost layer of shielding body and a size of the innermost layer of shielding body.

The method can demagnetize the shielding device with a plurality of layers of shielding bodies. It should be noted that the distributed demagnetizing coil system and the shielding device provided by the present invention can also adopt other demagnetizing methods as required. For example, for the multi-turn demagnetizing coil on the multilayer shield, demagnetization is performed layer by layer from inside to outside, and then layer by layer from outside to inside, and the demagnetization effect is more stable than other demagnetization sequences. Further, for the plurality of turns of demagnetizing coils on the same layer of a single-layer shielding body or a multi-layer shielding body, the demagnetizing coils in different directions (the central axis of the magnetic flux loop is indifferent directions) are preferably demagnetized at the same time, which not only reduces the time required for demagnetization, but also can well avoid the interference between different directions, and has a better demagnetization effect.

Performance of the shielding device provided by the present invention is also verified based on some specific demagnetizing methods. It is proved that the shielding device provided by the present invention has a very low internal residual static magnetic field. A shielding room composed of a two-layer permalloy shielding body and a one-layer aluminum shielding body has internal dimensions being 2.78 m long, 2.5 m wide and 2.35 m high, and a quasi-static magnetic field shielding coefficient being about 300. In an environment where the earth's magnetic field is about 50 µT, the external magnetic field can be shielded to 50 µT/300, that is, the internal static magnetic field is about 167 nT. After demagnetization is carried out by using the shielding device of the present invention, the amplitude of the internal static magnetic field is measured to be lower than 2 nT by the fluxgate magnetic sensor. The shielding room composed of a three-layer permalloy shielding body and a one-layer aluminum shielding body has internal dimensions being 1.85 m long, 1.85 m wide and 1.85 m high, and a quasi-static magnetic field shielding coefficient being about 5,000. In an environment where the earth's magnetic field is about 50 µT, the external magnetic field can be shielded to 50 µT/5000, that is, the internal static magnetic field is about 10 nT. After demagnetization is carried out by using the shielding device of the present invention, the amplitude of the internal static magnetic field is measured to be less than 130 pT by a superconducting quantum interferometer. The magnetic field environment is lower than those in published papers or public reports so far.

To sum up, the present invention provides the distributed demagnetizing coil system, the shielding device and the demagnetizing method. By defining the frequency, duration, envelope function, etc. of demagnetizing current in the controller, the demagnetizing current with any waveform can be realized to control the demagnetizing magnetic field more accurately and efficiently. The demagnetizing magnetic fields uniformly distributed in all positions of the shielding device are generated through the distributed demagnetizing coils. Through the demagnetizing coil connection mode without magnetic interference, the influence of interference magnetic field generated by each connecting wire can be ignored. The present invention can realize the deep demagnetization of the shielding device, reduce the residual static magnetic field inside the shielding device, and play an important supporting role in the research of biomagnetism, basic physics experiment, aeromagnetic detection, geomagnetic anomaly detection and the like by using the shielding device. Further, the corresponding shielding device includes but is not limited to a cube or cuboid shielding room or shielding box of various sizes, as well as a cylindrical shielding cylinder. The present invention has a wide application scope, convenient operations, high precision and a good demagnetization effect.

Finally, it should be noted that the above embodiments are only used to illustrate the technical solutions of the present invention, but not to limit the present invention. Although the present invention has been described in detail with reference to the foregoing embodiments, those ordinary skilled in the art shall understand that the technical solutions described in the foregoing embodiments can still be modified, or some of technical features can be equivalently replaced. These modifications or substitutions do not make the essence of the corresponding technical solutions deviate from the spirit and scope of the technical solutions of each embodiment of the present invention.

We claim:

1. A distributed demagnetizing coil system, comprising a plurality of turns of demagnetizing coils and a plurality of connecting wires, wherein the plurality of turns of demagnetizing coils are evenly wound on each shielding surface of a shielding body in a shielding device at intervals, one half of each turn of demagnetizing coil is located on the inner side of the wound shielding body and the other half of each turn of demagnetizing coil is located on the outer side of the wound shielding body for providing corresponding demagnetizing magnetic fields to form a closed magnetic flux loop;

the connecting wires are provided on the outer side of the shielding surface in an inflection manner, one half of each connecting wire is a current outlet connecting wire and is connected to the corresponding demagnetizing coil, the other half of each connecting wire is a current loop connecting wire and is reversely inflected along an original path, and the current outlet connecting wire and the current loop connecting wire are connected to a power supply module, so that corresponding demagnetizing current is introduced into each demagnetizing coil connected thereto;

wherein the demagnetizing current introduced into the demagnetizing coil is a linear attenuation demagnetizing current, a second-order attenuation demagnetizing current or an exponential attenuation demagnetizing current;

an envelope function expression of the linear attenuation demagnetizing current is:

$$I_E = I_M \left(1 - \frac{tf_D}{n}\right)$$

where $I_M$ is the demagnetizing current that saturates the demagnetizing magnetic field in the direction, $f_D$ is an AC frequency, and n is the number of alternating periods;

an envelope function expression of the second-order attenuation demagnetizing current is:

$$I_E = I_M \left(\frac{tf_D}{n} - 1\right)^2$$

an envelope function expression of the exponential attenuation demagnetizing current is:

$$I_E = I_M \, e^{-b\frac{tf_D}{n}}$$

where $I_M$ is the demagnetizing current that saturates the demagnetizing magnetic field in the direction, $f_D$ is an AC frequency, n is the number of alternating periods, and b is an adjustment parameter used to adjust a decreasing speed of exponential attenuation;

a current intensity expression of the demagnetizing current introduced into the demagnetizing coil is:

$I = I_E \sin(2\pi f_D t)$.

2. The distributed demagnetizing coil system according to claim 1, wherein in the connecting wires, the current loop connecting wire is arranged outside the current outlet connecting wire.

3. The distributed demagnetizing coil system according to claim 1, wherein the power supply module comprises a controller which is connected to each connecting wire and used for generating and sending a corresponding control instruction according to user input to control the demagnetizing current introduced into each demagnetizing coil;

the control instruction generated by the controller comprises a digital waveform corresponding to the demagnetizing current;

the power supply module further comprises:

a digital-to-analog converter connected to the controller and used for receiving the digital waveform and converting the same into an analog signal;

a voltage divider connected to the digital-to-analog converter and used for receiving the analog signal and adjusting an amplitude thereof;

a low-pass filter connected to the voltage divider and used for receiving the analog signal with an adjusted amplitude and filtering a high-frequency interference signal therein;

a power amplifier connected to the low-pass filter and used for receiving the filtered analog signal and outputting a high-power demagnetizing current;

a transformer connected to the power amplifier and used for receiving the high-power demagnetizing current and filtering a DC bias of the demagnetizing current; and a relay connected to the transformer and the connecting wire and used for controlling switching of the corresponding demagnetizing coil.

4. A shielding device, comprising the distributed demagnetizing coil system of claim 1 and at least one layer of the shielding body.

5. The shielding device according to claim 4, wherein the shielding body has a hollow cuboid structure with six plane shielding surfaces, and a plurality turns of demagnetizing coils are arranged on the six plane shielding surfaces; one half of each turn of demagnetizing coil is located on the inner side of the wound plane shielding surface and the other half is located on the outer side of the plane shielding surface; the turns of demagnetizing coils wound on the four plane shielding surfaces arranged in any direction are distributed in parallel at intervals to form a magnetic flux loop corresponding to the direction; and the corresponding demagnetizing coils on the six plane shielding surfaces form a three-direction orthogonal magnetic flux loop.

6. The shielding device according to claim 5, wherein the interval between the two adjacent turns of parallel demagnetizing coils wound on any shielding surface does not exceed ⅓ of a vertical dimension of the shielding surface along the demagnetizing coil.

7. The shielding device according to claim 4, wherein the shielding body has a hollow cylinder structure, and has an arc-shaped shielding surface and two planar circular shielding surfaces; on the arc-shaped shielding surface, the turns of demagnetizing coils are distributed in parallel at intervals along a circumferential direction of the cylinder, and on the upper and lower planar circular shielding surfaces, the turns of demagnetizing coils are distributed at intervals along a circumferential direction of the planar circular shielding surface around which they are wound.

8. A demagnetizing method, which realizes demagnetization based on the shielding device of claim 4, wherein all layers of shielding bodies in the shielding device are demagnetized at the same time, and demagnetization time is set according to the difference between a size of the outermost layer of shielding body and a size of the innermost layer of shielding body.

* * * * *